United States Patent
Copeland et al.

(10) Patent No.: US 7,667,967 B1
(45) Date of Patent: Feb. 23, 2010

(54) LIQUID-COOLED RACK WITH OPTIMIZED RACK HEAT EXCHANGER DESIGN FOR NON-UNIFORM POWER DISSIPATION

(75) Inventors: David W. Copeland, Mountain View, CA (US); Marlin R. Vogel, Fremont, CA (US); Andrew R. Masto, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/187,190

(22) Filed: Aug. 6, 2008

(51) Int. Cl.
*H05K 7/20* (2006.01)
*G06F 1/20* (2006.01)

(52) U.S. Cl. ............. 361/696; 361/679.47; 361/679.48; 361/679.5; 361/679.53; 361/694; 361/695; 361/698; 361/699; 361/701; 165/104.33

(58) Field of Classification Search ................................ 361/679.46–679.48, 679.5, 679.53–679.54, 361/690, 694–699, 701, 703–704, 715–716; 165/80.3–80.4, 104.33, 185; 454/184
See application file for complete search history.

(56) References Cited

U.S. PATENT DOCUMENTS

| | | | |
|---|---|---|---|
| 6,031,717 A * | 2/2000 | Baddour et al. | 361/679.49 |
| 6,253,839 B1 * | 7/2001 | Reagen et al. | 165/151 |
| 6,378,204 B1 * | 4/2002 | Kim et al. | 29/890.047 |
| 6,923,013 B2 * | 8/2005 | Chiang et al. | 62/246 |
| 7,002,799 B2 * | 2/2006 | Malone et al. | 361/699 |
| 7,073,347 B2 * | 7/2006 | Hermes et al. | 62/515 |
| 7,280,358 B2 * | 10/2007 | Malone et al. | 361/701 |
| 7,315,448 B1 * | 1/2008 | Bash et al. | 361/701 |
| 7,325,588 B2 * | 2/2008 | Malone et al. | 165/80.2 |
| 7,359,191 B2 * | 4/2008 | Yamana et al. | 361/679.48 |
| 2005/0231910 A1 * | 10/2005 | Malone et al. | 361/695 |
| 2008/0134506 A1 * | 6/2008 | Cushen | 29/890.046 |

FOREIGN PATENT DOCUMENTS

JP          07189684 A  *  7/1995

* cited by examiner

*Primary Examiner*—Jayprakash N Gandhi
*Assistant Examiner*—Robert J Hoffberg
(74) *Attorney, Agent, or Firm*—Osha • Liang LLP

(57) ABSTRACT

A cooling system for a rack-mount server including at least one blade and a system enclosure includes a liquid cooling line, at least one heat exchanger connected to the liquid cooling line and including a plurality of fins divided into one or more sections of the plurality of fins, wherein the fin density of the plurality of fins varies over the one or more sections, and a plurality of fans configured to blow air through the at least one heat exchanger and cool the at least one blade in the rack-mount server.

11 Claims, 3 Drawing Sheets

US 7,667,967 B1

LIQUID-COOLED RACK WITH OPTIMIZED RACK HEAT EXCHANGER DESIGN FOR NON-UNIFORM POWER DISSIPATION

BACKGROUND OF INVENTION

Modern rack-mount server systems include single and multiple liquid heat exchangers that cool air through a rack-mount server system to enable the deployment of high density electronic modules ("blades") within the system. However, individual portions of blades within a rack-mount server system may not dissipate heat evenly. Thus, the heat exchangers must be designed to cool based on the worst case portion of an individual blade. Because various portions of a blade do not dissipate evenly, the heat exchangers may overcool lower power portions of an individual blade, resulting in increased utility costs for the entire server system.

SUMMARY OF THE INVENTION

A cooling system for a rack-mount server including at least one blade and a system enclosure is disclosed herein. The cooling system includes a liquid cooling line, at least one heat exchanger connected to the liquid cooling line and including a plurality of fins divided into one or more sections of the plurality of fins, wherein the fin density of the plurality of fins varies over the one or more sections, and a plurality of fans configured to blow air through the at least one heat exchanger and cool the at least one blade in the rack-mount server.

DETAILED DESCRIPTION

Specific details of the present disclosure will now be described in detail with reference to the accompanying figures.

Figure 1:
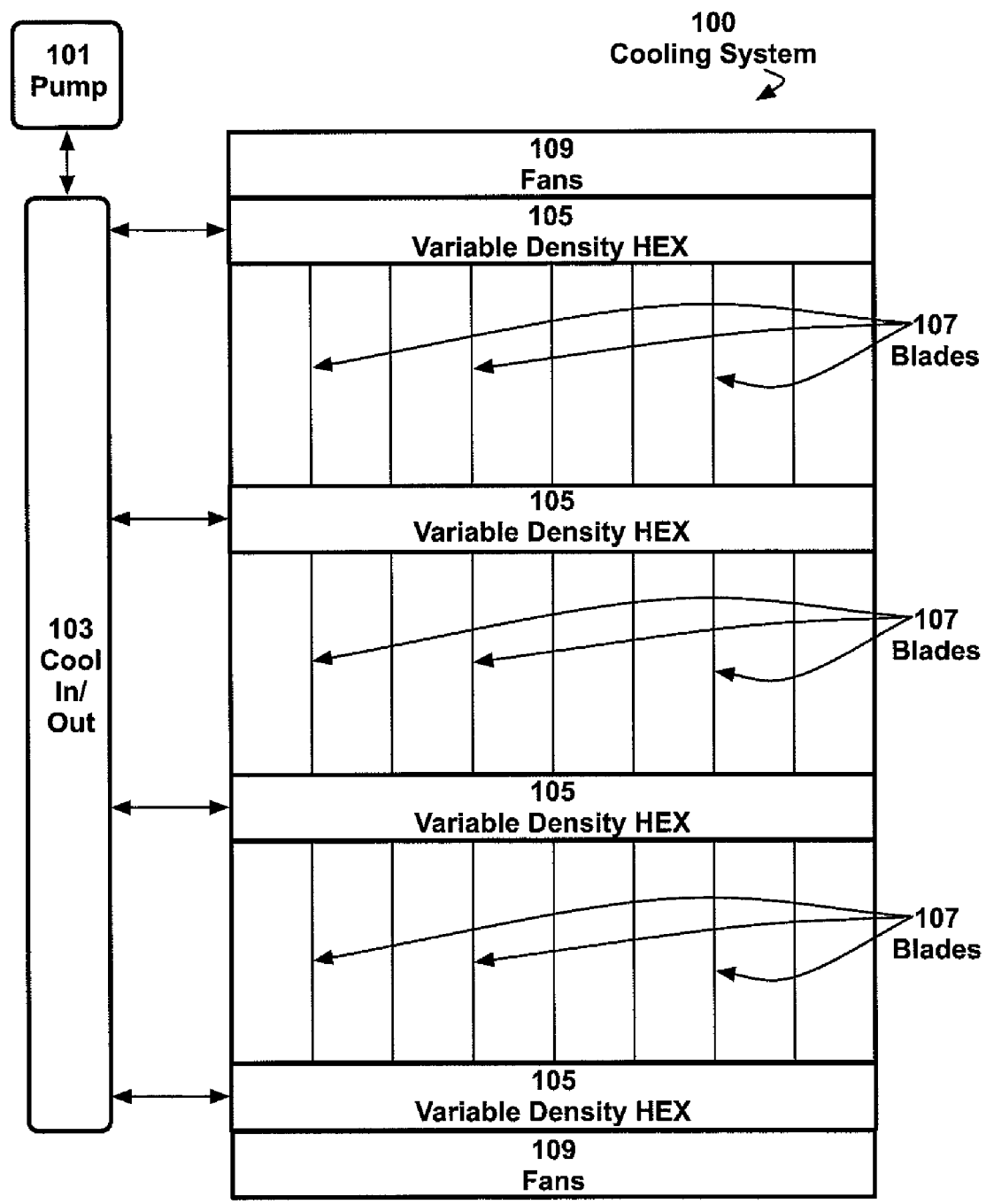
FIG. 1 shows a front view of a rack-mount server system in accordance with embodiments disclosed herein.

Referring now to FIG. 1, a front view of a cooling system for a rack-mount server in accordance with embodiments disclosed herein is shown. The cooling system 100 includes a pump 101, a cooling intake/outtake line 103, a plurality of variable fin density heat exchangers ("HEX") 105, a plurality of blades, or electronic components, 107, and a plurality of fans 109 in accordance with embodiments disclosed herein. The fans 109 are configured at the top and bottom of the rack-mount server to blow air through the heat exchangers 105 in order to cool the blades 107. The blades 107 are divided into different racks, and there at least one heat exchanger 105 corresponding to each of the different racks. Each heat exchanger 105 is configured to take in cooled liquid from the cooling intake/outtake line 103, chill air flowing across the heat exchanger 105, and return warmed liquid through the cooling intake/outtake line 103. The pump 101 may maintain pressure through the cooling intake/outtake line 103. The heat exchangers 105 include variable fin density in order to accommodate variable heat dissipation from the blades 107.

Figure 2:
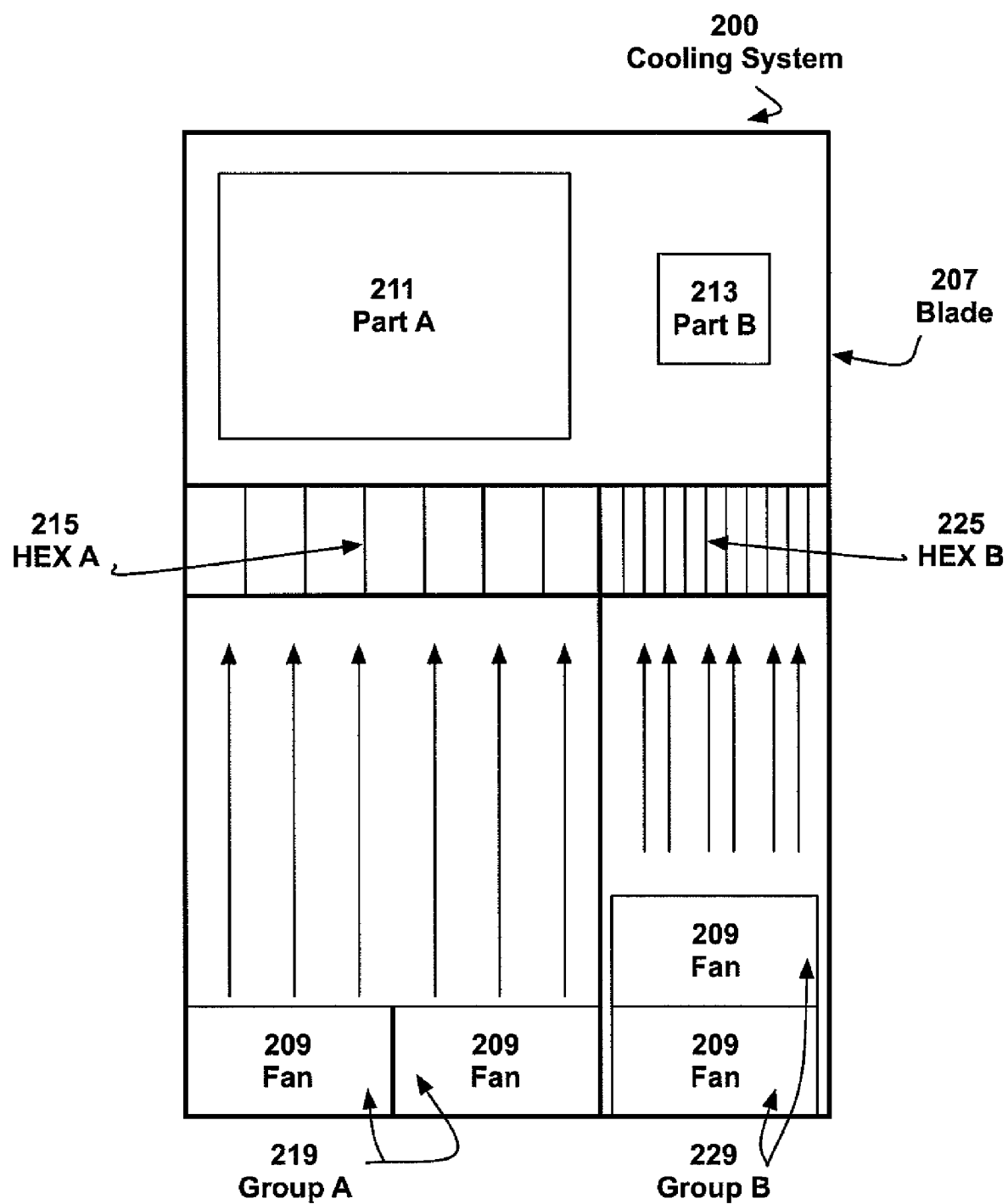
FIG. 2 shows a side view of a rack-mount server system in accordance with embodiments disclosed herein.

Referring now to FIG. 2, a side view of a cooling system for a rack-mount server in accordance with embodiments disclosed herein is shown. The cooling system 200 includes a blade 207, a heat exchanger comprising two sections, HEX A 215 and HEX B 225, and two groups of fans, Group A 219 and Group B 229 in accordance with embodiments disclosed herein. The blade 207 may include two sets of electronic components, Part A 211 and Part B 213, which each have different heat dissipation characteristics. For example, Part A 211 may include large passive components that produce a relatively small amount of heat, and Part B 213 may include a processor or another small component that produces a relatively large amount of heat. Advantageously, dividing the cooling system into sections of heat exchangers and groups of fans corresponding to the sets of electronic components in the blade minimizes the necessary power to cool the overall system.

In order to minimize the total power, the structure of the cooling system is optimized to increase cooling capacity through the Part B 213 of the blade 207, because Part B 213 dissipates more heat than Part A 211. Alternatively, Part B 213 may simply have a higher heat density in terms of power per unit area than Part A 211. In this case, it may also be advantageous to direct cooling to the denser heat production. HEX A 215 is designed to correspond to Part A 211 and includes a lower density arrangement of fins, and HEX B 225 is designed to correspond to Part B 213 and includes a higher density arrangement of fins.

However, the higher density of fins in Part 213 may decrease the overall air flow over HEX B 225. Accordingly, the fans 209 are also divided into Group A 219 and Group B 229. In order to control air flow through each of the heat exchangers, Group A 219 and Group B 229 have different fan densities. For example, FIG. 2 illustrates Group B 229 as having the same number of fans as Group A 219, but Group B 229 corresponds to a much smaller volume, and, therefore has a higher fan density than Group A 219. The fan densities of Group A 219 and Group B 229 may, for example, be designed to supply substantially similar cubic air flow through the corresponding heat exchangers HEX A 215 and HEX B 225, respectively.

Figure 3A:
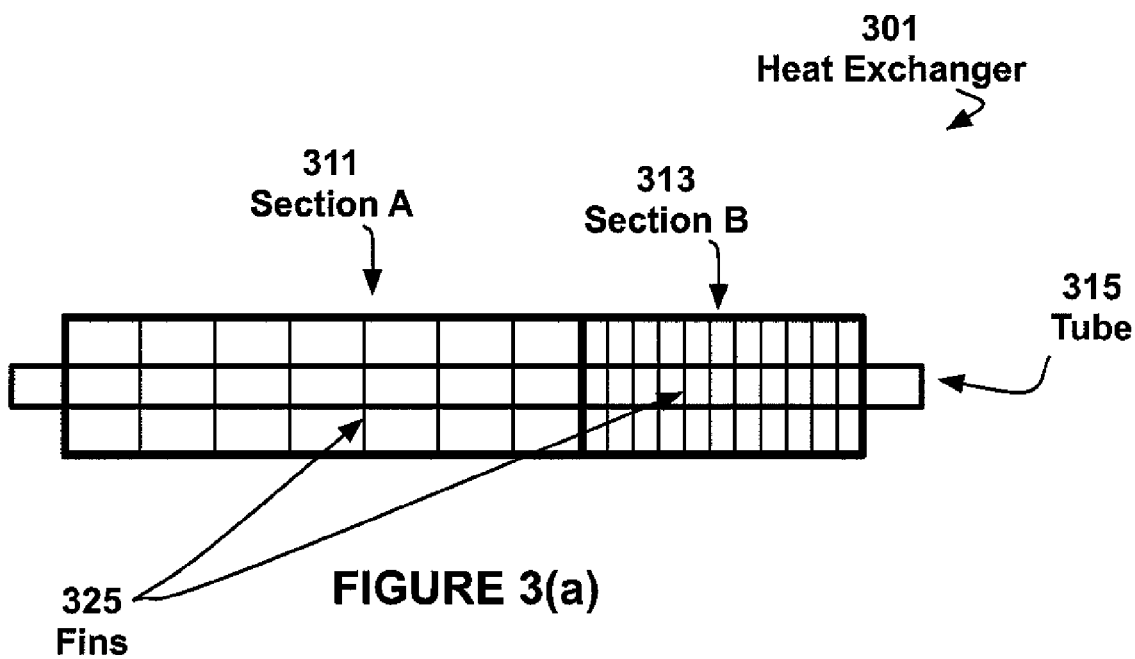
FIG. 3(a) shows a side view of a tube-fin heat exchanger in accordance with embodiments disclosed herein.

Referring now to FIG. 3(a), a side view of a heat exchanger 301 in accordance with embodiments disclosed herein is shown. The heat exchanger 301 includes two sections of fins 325, Section A 311 and Section B 313, and a tube 315. The tube 315 may be configured to transport cooled liquid and return warmed liquid to, for example, the cooling intake/outtake line 103 shown in FIG. 1. Section A 311 and Section B 313 each have different densities of fins in accordance with the example discussed above with respect to FIG. 2. Accordingly, Section B 313 has a higher fin density than Section A 311 in order to increase cooling capacity. The tube 315 is configured to fit through each of the fins 325 and conduct heat to and from the fins 325.

Figure 3B:
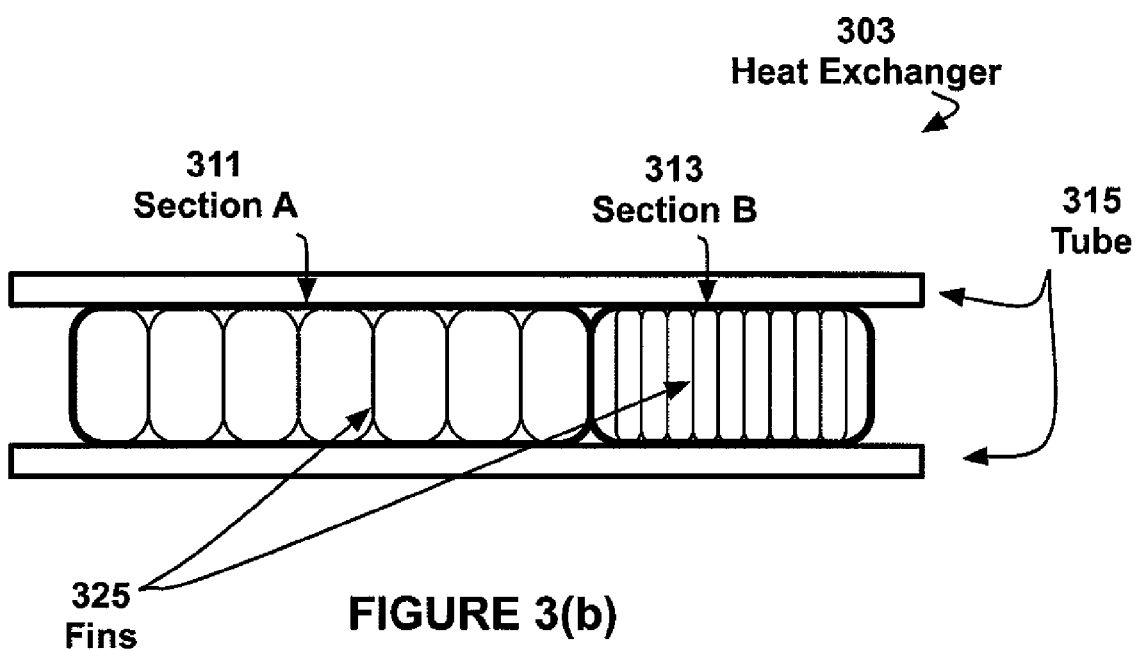
FIG. 3(b) shows a side view of a tube-fin heat exchanger in accordance with embodiments disclosed herein.

Referring now to FIG. 3(b), a side view of a heat exchanger 303 in accordance with embodiments disclosed herein is shown. The heat exchanger 303 includes two sections of fins 325, Section A 311 and Section B 313, and a flattened tube 315. The flattened tube 315 may be configured to transport cooled liquid and return warmed liquid to, for example, the cooling intake/outtake line 103 shown in FIG. 1. Section A 311 and Section B 313 each have different densities of fins in accordance with the example discussed above with respect to FIG. 2. Accordingly, Section B 313 has a higher fin density than Section A 311 in order to increase cooling capacity. The fins 325 are configured to fit within the flattened tube 315 and conduct heat to and from the flattened tube 315.

Though the exemplary embodiments discussed above have been restricted to the possibility of two different areas of heat density within a blade, the invention is not so limited. For example, a blade may have any number of areas with different heat densities, and the number of groups of fans and sections of fins may be scaled appropriately.

Embodiments of the cooling system disclosed herein may exhibit one or more of the following advantages. The cooling system disclosed herein may reduce costs for cooling a rack-mount server by reducing the fan power required for cooling the rack-mount server. The cooling system disclosed herein may also allow for cooling to be distributed according to the heat dissipation of the blades in a rack-mount server.

While the invention has been described with respect to a limited number of embodiments, those skilled in the art, having benefit of this disclosure, will appreciate that other embodiments may be devised which do not depart from the scope of the invention as disclosed herein. Accordingly, the scope of the invention should be limited only by the attached claims.

What is claimed is:

1. A cooling system for a rack-mount server comprising at least one blade and a system enclosure, comprising:
    a liquid cooling line;
    at least one heat exchanger connected to the liquid cooling line and comprising a plurality of fins divided into one or more sections of the plurality of fins, wherein the fin density of the plurality of fins varies over the one or more sections; and
    a plurality of fans configured to blow air through the at least one heat exchanger and cool the at least one blade in the rack-mount server,
    wherein the plurality of fans are divided into one or more groups corresponding to the one or more sections of the plurality of fins, and
    wherein the fan density of the plurality of fans varies over the one or more groups based on the fin density of the section of the plurality of fins to which the group corresponds.

2. The cooling system of claim 1, wherein the liquid cooling line is a tube that runs through the plurality of fins.

3. The cooling system of claim 1, wherein the liquid cooling line comprises one or more flattened tubes disposed around the plurality of fins.

4. The cooling system of claim 1, wherein the at least one heat exchanger is a tube-fin heat exchanger.

5. The cooling system of claim 1, wherein relative positions within the rack-mount server of each of the sections of the plurality of fins depend on the heat dissipation characteristics of the at least one blade.

6. The cooling system of claim 1, wherein the fin densities of each of the sections of the plurality of fins depend on the heat dissipation characteristics of the at least one blade.

7. The cooling system of claim 6, wherein the fin density of a section of the plurality of fins corresponding to a higher power portion of the blade is higher than the fin density of a section of the plurality of fins corresponding to a lower power portion of the blade.

8. The cooling system of claim 1, wherein the fan densities of each of the groups of the plurality of fans depend on the heat dissipation characteristics of the at least one blade.

9. The cooling system of claim 8, wherein the fan density of a group of the plurality of fans corresponding to a higher power portion of the blade is higher than the fan density of a group of the plurality of fans corresponding to a lower power portion of the blade.

10. The cooling system of claim 1, wherein the total cubic air flow rate of each group of the plurality of fans through the corresponding section of fins of the at least one heat exchanger is substantially constant.

11. The cooling system of claim 1, wherein the fan density of a group of the plurality of fans corresponding to a section of higher fin density is higher than the fan density of a group of the plurality of fans corresponding to a section of lower fin density.

* * * * *